United States Patent
Arai

(10) Patent No.: US 7,952,130 B2
(45) Date of Patent: May 31, 2011

(54) EDRAM-TYPE SEMICONDUCTOR DEVICE INCLUDING LOGIC CIRCUIT SECTION FEATURING LARGE CAPACITANCE CAPACITOR, AND CAPACITOR DRAM SECTION FEATURING SMALL CAPACITANCE CAPACITOR

(75) Inventor: Shintaro Arai, Kanagawa (JP)

(73) Assignee: Renesas Electronics Corporation, Kanagawa (JP)

( * ) Notice: Subject to any disclaimer, the term of this patent is extended or adjusted under 35 U.S.C. 154(b) by 9 days.

(21) Appl. No.: 11/356,006

(22) Filed: Feb. 17, 2006

(65) Prior Publication Data
US 2006/0180841 A1    Aug. 17, 2006

(30) Foreign Application Priority Data

Feb. 17, 2005    (JP) .................... 2005-040500

(51) Int. Cl.
*H01L 29/94*    (2006.01)
(52) U.S. Cl. .................... 257/309; 257/306; 257/296
(58) Field of Classification Search .......... 257/E21.646, 257/296, 306, 309
See application file for complete search history.

(56) References Cited

U.S. PATENT DOCUMENTS

| | | | | |
|---|---|---|---|---|
| 5,313,089 A | * | 5/1994 | Jones, Jr. ..................... | 257/295 |
| 5,498,562 A | * | 3/1996 | Dennison et al. ............. | 438/253 |
| 6,384,468 B1 | * | 5/2002 | Bernstein et al. ............. | 257/532 |
| 6,417,535 B1 | * | 7/2002 | Johnson et al. ............... | 257/306 |
| 6,765,255 B2 | * | 7/2004 | Jin et al. ....................... | 257/301 |

FOREIGN PATENT DOCUMENTS

| | | |
|---|---|---|
| JP | 2001-148471 | 5/2001 |
| JP | 2003-168780 | 6/2003 |
| JP | 2003-179163 | 6/2003 |
| JP | 2003-297942 | 10/2003 |

OTHER PUBLICATIONS

Machine translation of JP-2003-168780, 11 pages.*
Japanese Patent Office issued a Japanese Office Action dated Apr. 13, 2010, Application No. 2005-040500.

* cited by examiner

*Primary Examiner* — Bradley K Smith
(74) *Attorney, Agent, or Firm* — Young & Thompson

(57) ABSTRACT

In an eDRAM-type semiconductor device, a dynamic random access memory (DRAM) section and a logic circuit section are formed on a semiconductor substrate, and an insulating layer is formed on the semiconductor substrate. A first capacitor is formed in the insulating layer at the DRAM section, the first capacitor defining a part of memory cell of the DRAM section. A second capacitor is formed in the insulating layer at the logic circuit section. The first capacitor comprises a lower electrode layer formed on an inner wall face of a hole formed in the insulating layer, and the second capacitor comprises a first lower electrode layer portion formed on an inner wall face of a groove formed in the insulating layer, and a second lower electrode layer portion formed on a surface of the insulating layer so as to be integrated with the first lower electrode portion.

11 Claims, 12 Drawing Sheets

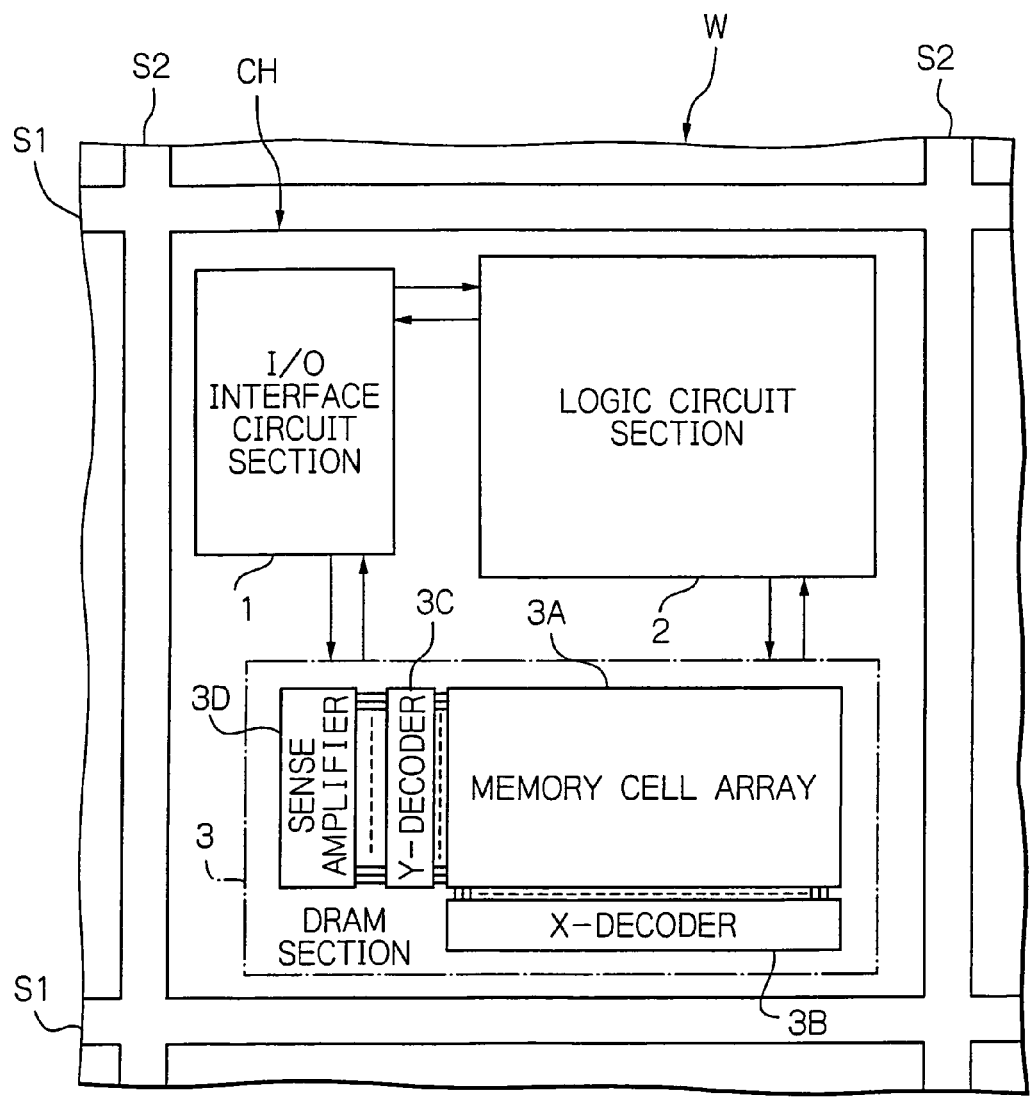

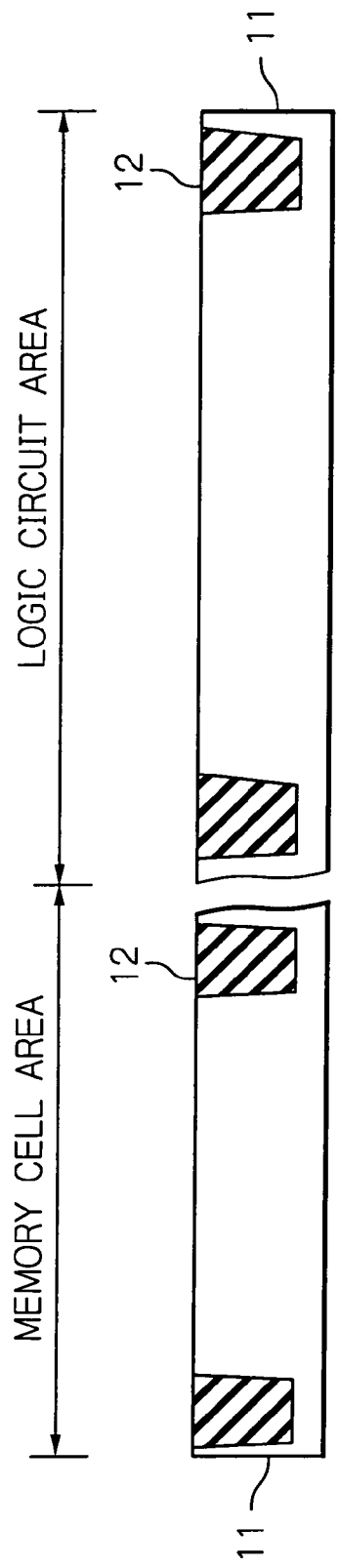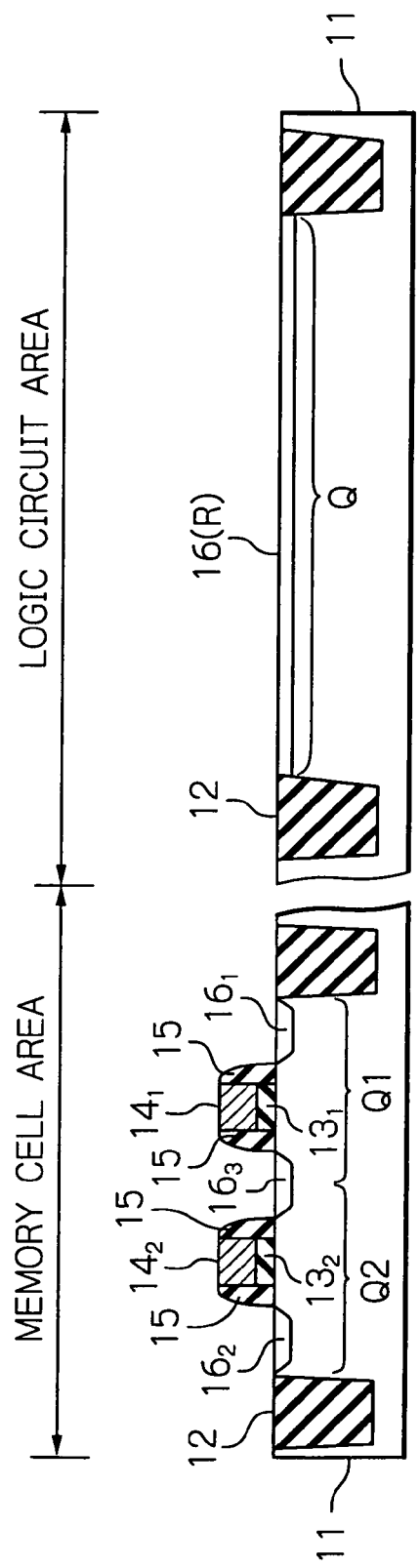

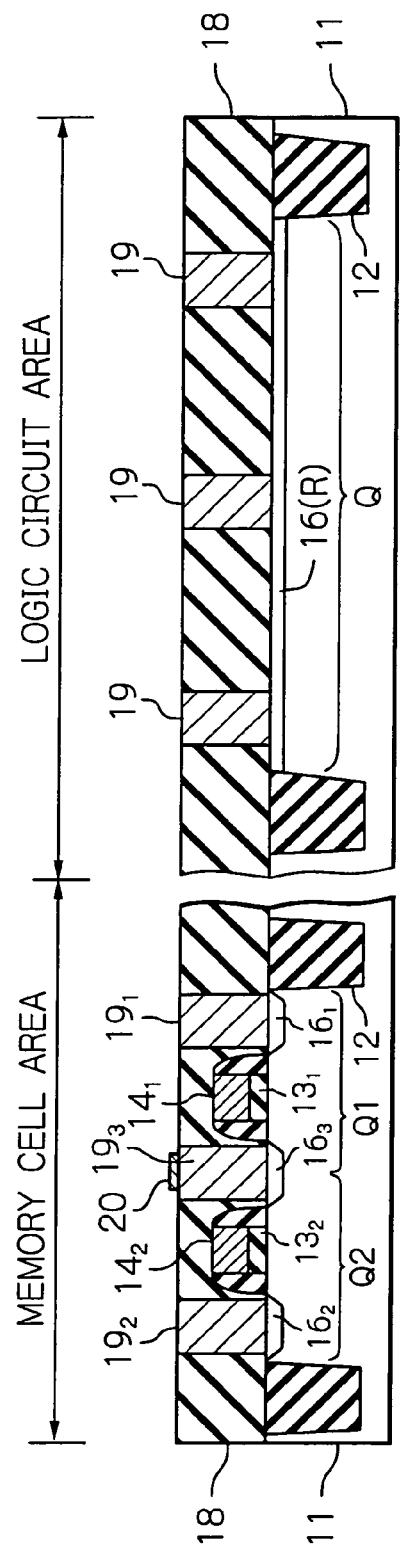
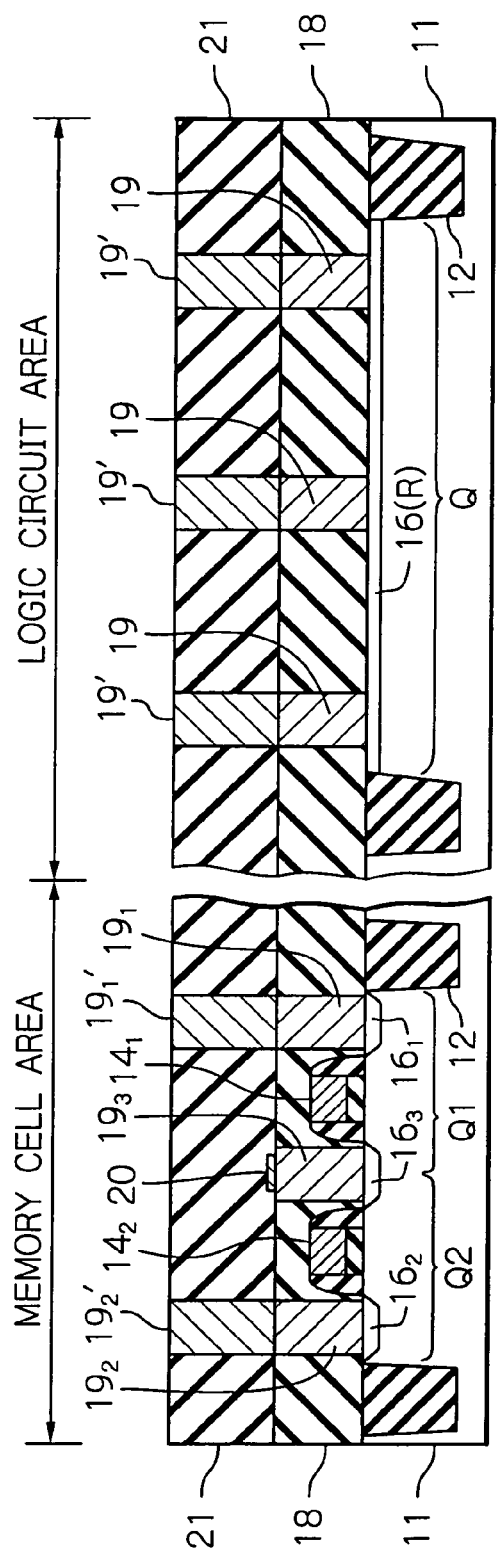

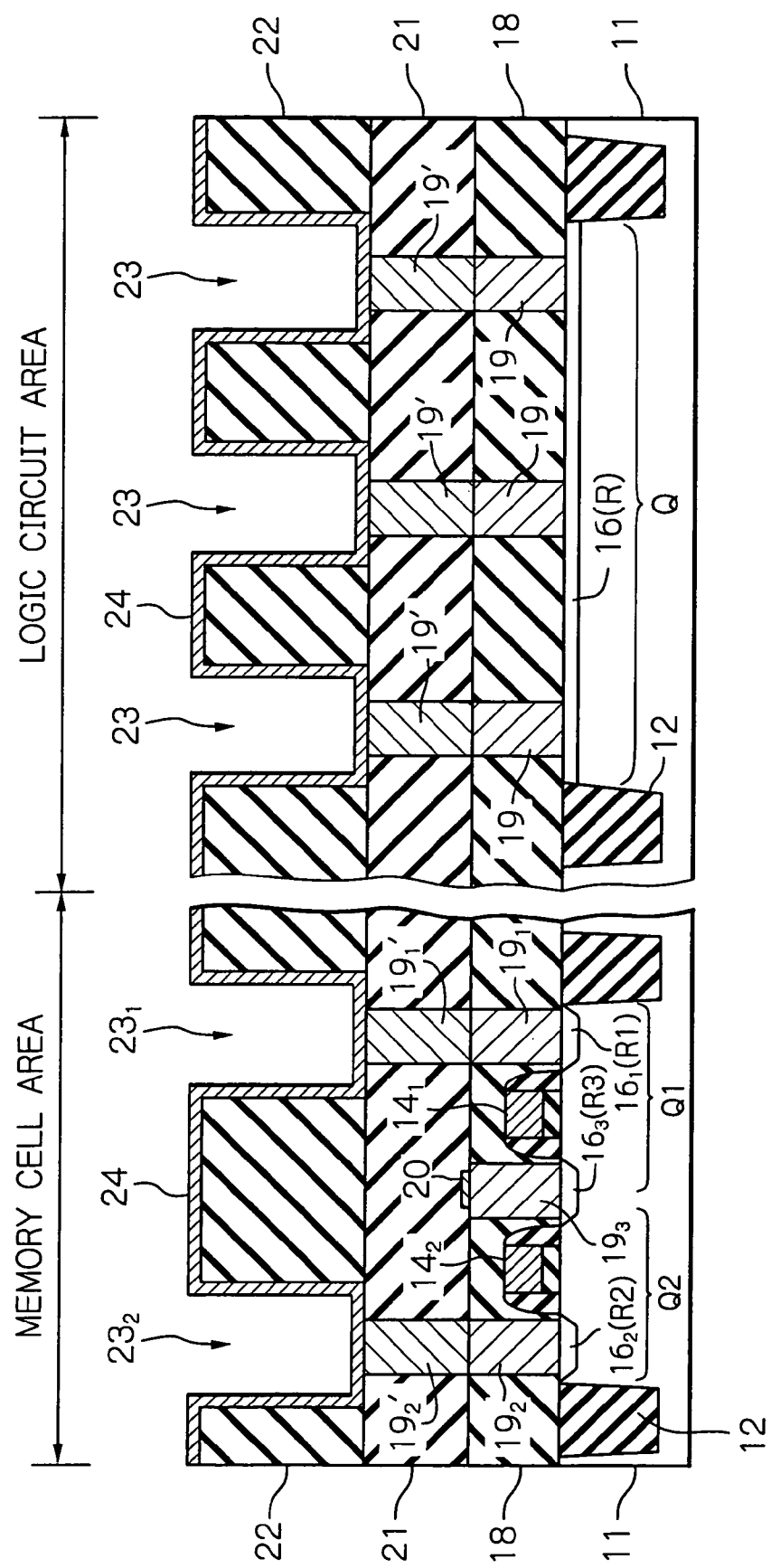

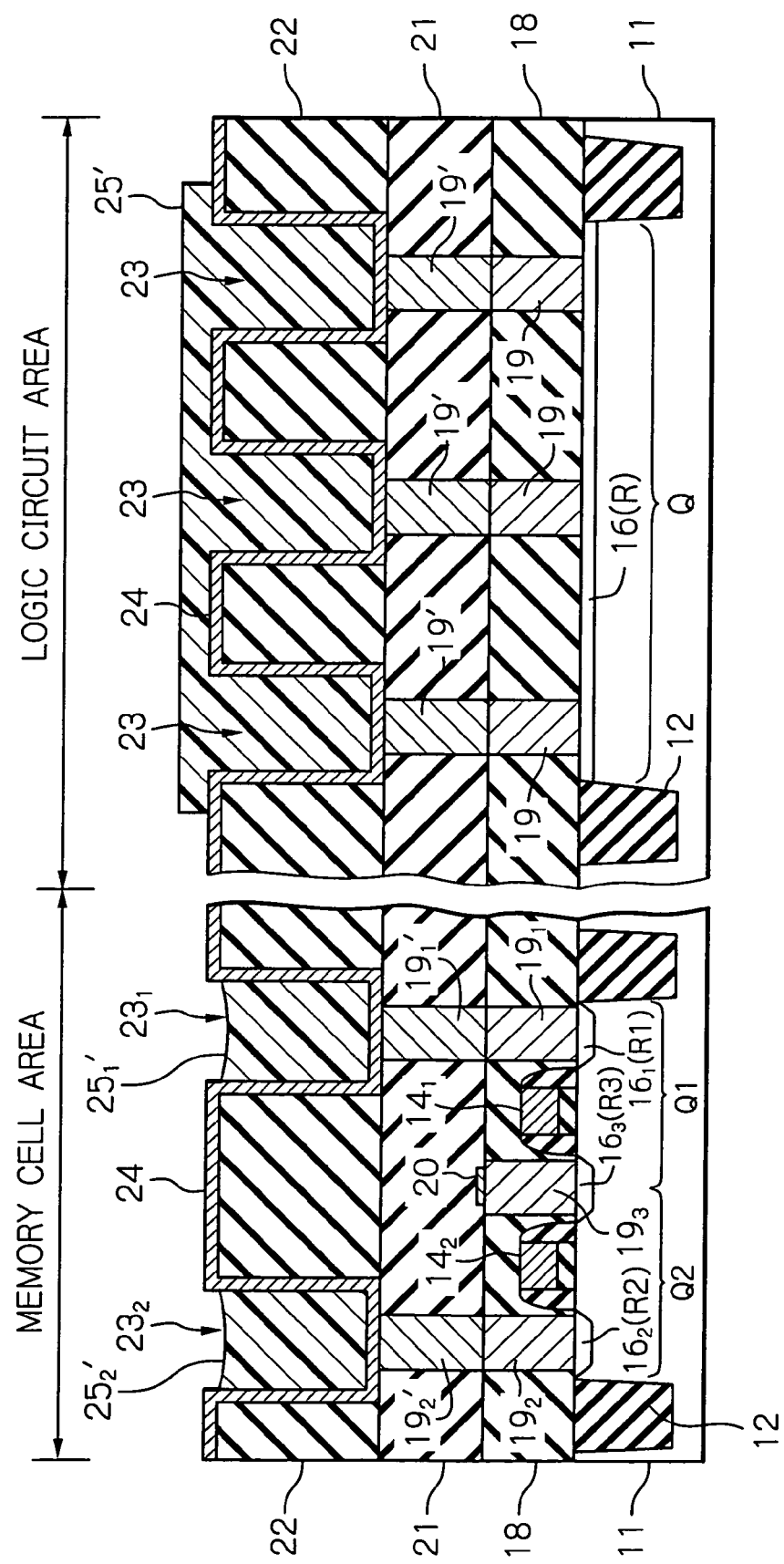

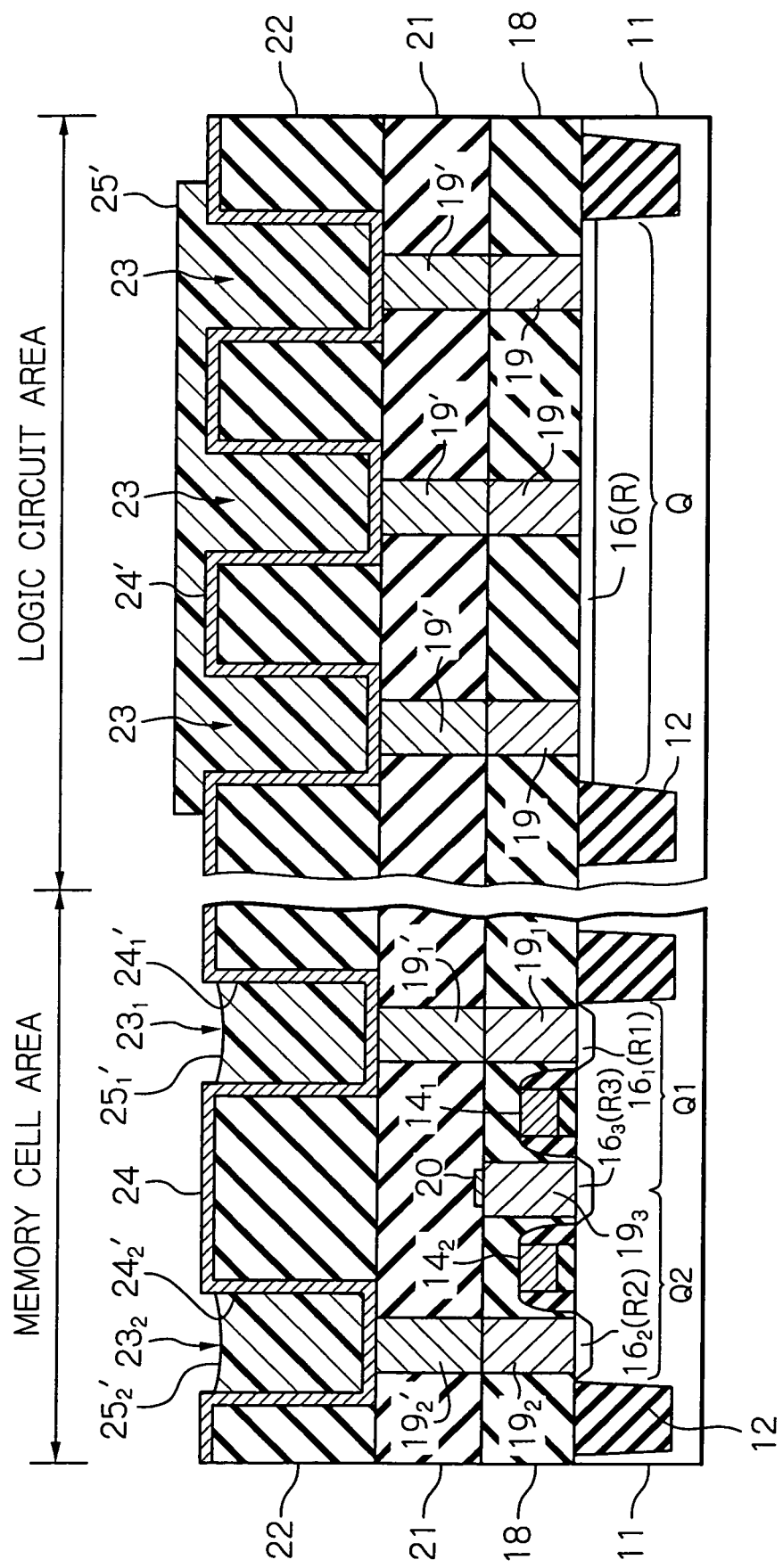

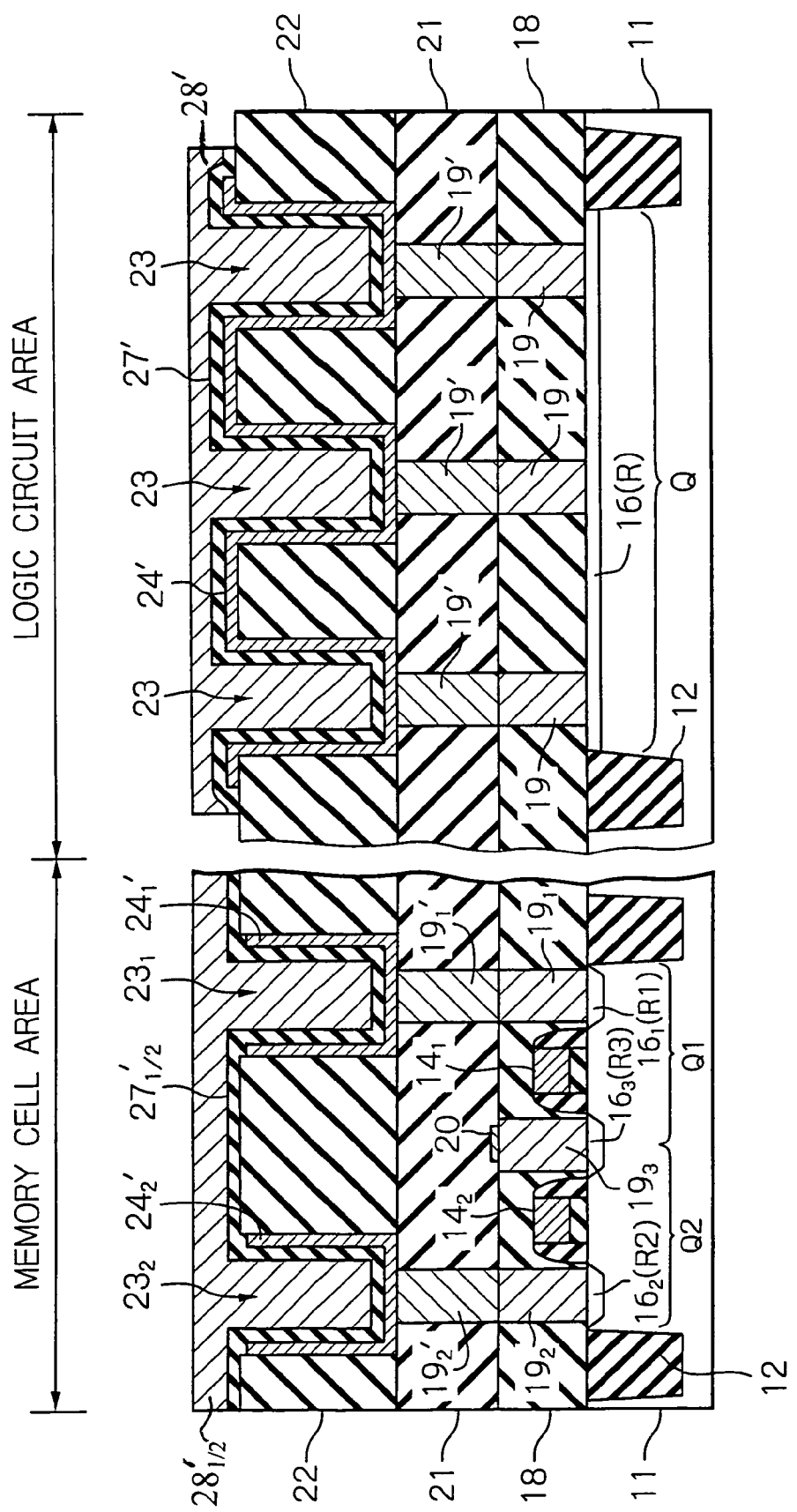

EDRAM-TYPE SEMICONDUCTOR DEVICE INCLUDING LOGIC CIRCUIT SECTION FEATURING LARGE CAPACITANCE CAPACITOR, AND CAPACITOR DRAM SECTION FEATURING SMALL CAPACITANCE CAPACITOR

BACKGROUND OF THE INVENTION

1. Field of the Invention

The present invention relates to an eDRAM-type semiconductor device including a logic circuit section and an embedded dynamic random access memory (eDRAM) section which are incorporated in one semiconductor substrate, and also relates to a method for manufacturing such an eDRAM-type semiconductor device.

2. Description of the Related Art

In a prior art process of manufacturing a plurality of eDRAM-type semiconductor devices, a semiconductor wafer such as a silicon wafer is prepared, and a surface of the semiconductor wafer is sectioned into a plurality of semiconductor chip areas which are defined by grid-like scribe line areas on the semiconductor wafer. The eDRAM-type semiconductor device includes a logic circuit section and a DRAM section, which are incorporated in one semiconductor substrate defining a semiconductor chip area.

The DRAM memory section includes a memory cell array in which a plurality of memory cells are formed, and each of the memory cells is composed of a metal oxide semiconductor (MOS) transistor or so-called cell transistor, and a capacitor associated therewith. In order to enhance the integration of the DRAM memory section, it is necessary to form the capacitor as small as possible. However, in order to ensure a given retention time in the DRAM memory section, the capacitor must have a certain capacitance. Namely, the opposed electrodes of the capacitor must have an area necessary to ensure the retention time.

For this reason, the capacitor is incorporated in a small hole formed in an insulating layer. In particular, a metal layer is formed on a surface of the insulating layer such that the hole is traversed with the metal layer. Then, a photoresist resin layer is formed on a surface of the insulating layer on the metal layer, and a portion of the metal layer which is formed on the surface of the insulating layer is removed by using a photolithography and etching process. Namely, the other portion of the metal layer which is formed on the inner wall face of the hole remains as a lower electrode of the capacitor.

The aforesaid photolithography and etching process involves an exposure process in which only the portion of the metal layer, formed on the surface of the insulating layer, is exposed with a light ray, such as an i-ray, a KrF-ray, an ArF-ray or the like. Namely, the other portion of the metal layer formed on the inner wall face of the hole is not exposed with the light ray. Nevertheless, in this prior art exposure process, no mask for masking the hole is used, because a diameter of the hole and an exposure time for the light ray are previously selected in accordance with a wavelength of the light ray to be used, so that the photoresist resin materials, with which the hole is stuffed, are not exposed with the light ray.

Note, in the prior art exposure process, a mask is merely used for exposing only one of the semiconductor chip areas on the semiconductor wafer with the light ray.

SUMMARY OF THE INVENTION

It has now been discovered that the prior art has a problem to be solved as mentioned hereinbelow.

There may be a case where a capacitor featuring a considerably large capacitance must be formed in the logic circuit section. In this case, it is impossible to simultaneously form the small capacitance capacitor and the large capacitance capacitor in the DRAM section and the logic circuit section, respectively, because the formation of the large capacitance capacitor in the logic circuit section is restrained by the conditions for forming the small capacitance capacitor in the DRAM section.

Although JP-2003-168780-A discloses another prior art process for simultaneously forming respective capacitors in a DRAM section and a logic circuit section which are incorporated in one semiconductor substrate, the capacitors have substantially the same configuration as each other. Namely, in this prior art process, it is impossible to form a large capacitance capacitor and a small-capacitance capacitor in the DRAM section and the logic circuit section, respectively.

In accordance with a first aspect of the present invention, there is provided an eDRAM-type semiconductor device, which comprises a semiconductor substrate, and a DRAM section and a logic circuit section incorporated in the semiconductor substrate, and an insulating layer formed on the semiconductor substrate. A first capacitor is formed in the insulating layer at the DRAM section, with the first capacitor defining a part of memory cell of the DRAM section, and a second capacitor is formed in the insulating layer at the logic circuit section. The first capacitor comprises a lower electrode layer formed on an inner wall face of a hole formed in the insulating layer. The second capacitor comprises a first lower electrode layer portion formed on an inner wall face of a groove formed in the insulating layer, and a second lower electrode layer portion formed on a surface of the insulating layer so as to be integrated with the first lower electrode portion.

Preferably, a depth of the hole and a depth of the groove are substantially equivalent to each other. Also, preferably, the first and second capacitors are placed at the same level.

The second capacitor may have a contact plug formed in the insulating layer so as to be connected to the first lower electrode layer portion. Also, the respective first and second capacitors may have contact plugs formed in the insulating layer so as to be connected to the lower electrode layer and the first lower electrode portion. In this case, preferably, heights of the contact plugs are substantially equivalent to each other, and diameters of the contact plugs are substantially equivalent to each other.

In accordance with a second aspect of the present invention, there is provided an eDRAM-type semiconductor device, which comprises a semiconductor substrate, a DRAM section and a logic circuit section incorporated in the semiconductor substrate, an insulating layer formed on the semiconductor substrate, a plurality of first capacitors formed in the insulating layer at the DRAM section, each of the first capacitors defining a part of a memory cell of the DRAM section, and a second capacitor formed in the insulating layer at the logic circuit section. The first capacitors comprise respective lower electrode layers formed on inner wall faces of holes formed in the insulating layer. The second capacitor comprises a plurality of first lower electrode layer portions formed on inner wall faces of grooves formed in the insulating layer, and a second lower electrode layer portion formed on a surface of the insulating layer so as to be integrated with the first lower electrode portions.

The grooves may be arranged in parallel with each other. Optionally, the grooves may be arranged in a grid-like manner.

In accordance with a third aspect of the present invention, there is provided a method for manufacturing an eDRAM-type semiconductor device including a DRAM section and a logic circuit section incorporated in a semiconductor substrate. The method comprises the steps of: forming an insulating layer on the semiconductor substrate; forming at least one hole and at least one groove in the insulating layer at the DRAM section and the logic memory section, respectively; forming a metal layer on a surface of the insulating layer such that the hole and the groove are traversed with the metal layer; coating the metal layer with a photoresist resin material to thereby form a photoresist resin layer thereon so that the hole and the groove are stuffed with the photoresist resin material; exposing the photoresist resin layer with a light ray while masking a local area of the photoresist resin layer including the groove with a photomask, a diameter of the hole and an exposure time for the light ray being previously selected in accordance with a wavelength of the light ray to be used, so that the photoresist resin material, with which the hole are stuffed, is not exposed with the light ray; developing the photoresist resin layer so that the exposed photoresist resin material is removed from the photoresist resin layer so that the photoresist resin material is left as a first photoresist mask in the hole, and so that the photoresist resin material is left as a second photoresist mask on the local area including the groove; and etching the metal layer, using the first and second photoresist masks, so that a lower electrode layer for a first capacitor to be formed in the DRAM section is left as a part of the metal layer on an inner wall face of the hole, and so that a lower electrode layer for a second capacitor to be formed in the logic circuit section is left as another part of the metal layer at the local area including the groove.

BRIEF DESCRIPTION OF THE DRAWINGS

The present invention will be more clearly understood from the description set forth below, with reference to the accompanying drawings, wherein:

FIG. 1 is a partial plan view of a semiconductor wafer, showing an embodiment of the eDRAM-type semiconductor device according to the present invention, which is formed in a semiconductor chip area defined on the semiconductor wafer;

FIGS. 3A through 3K are cross-sectional views for explaining a method for manufacturing the aforesaid eDRAM-type semiconductor device of FIG. 1.

DESCRIPTION OF THE PREFERRED EMBODIMENTS

Figure 2A:
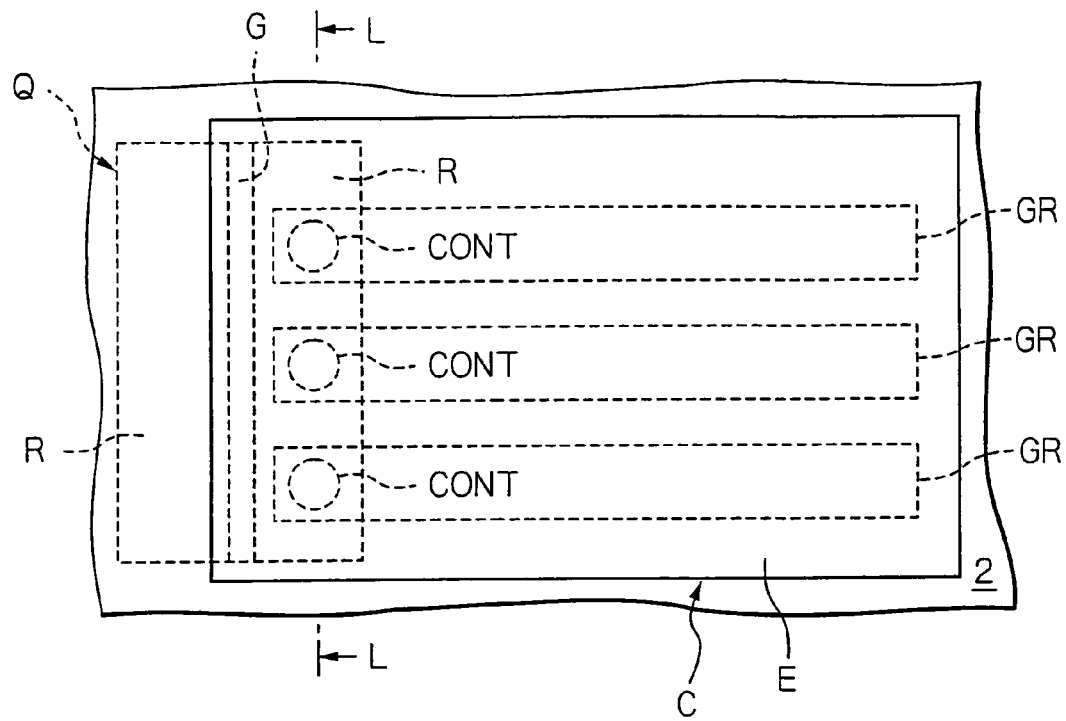
FIG. 2A is a partial plan view showing a MOS transistor and a multi-structural capacitor formed in a logic circuit section of the eDRAM-type semiconductor device of FIG. 1.
Figure 2B:
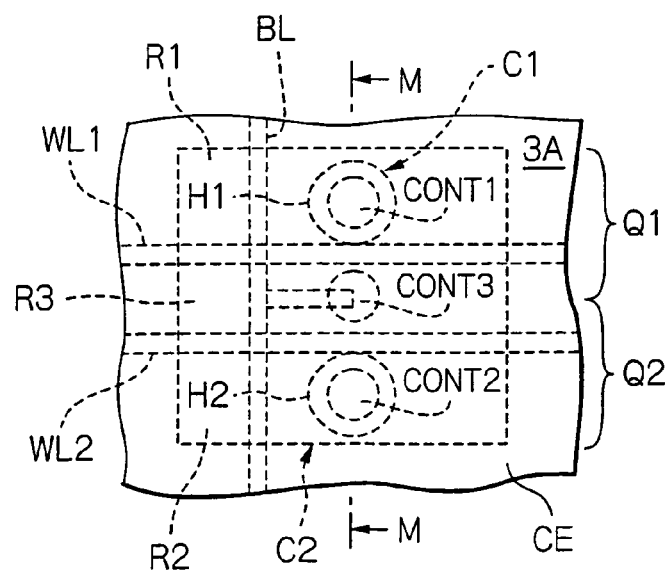
FIG. 2B is a detailed partial plan view showing memory cells formed in a memory cell array of a DRAM section of the eDRAM-type semiconductor device of FIG. 1.

With reference to FIG. 1 and FIGS. 2A and 2B, an embodiment of the eDRAM-type semiconductor device according to the present invention is explained below.

First, in FIG. 1 which illustrates the eDRAM-type semiconductor device in a plan view, reference W indicates a semiconductor wafer, such as a silicon wafer, and a plurality of semiconductor chip areas CH are defined on the semiconductor wafer by grid-like scribe line areas S1 and S2.

As representatively shown in this drawing, the eDRAM-type semiconductor device is manufactured in each of the semiconductor chip areas CH, and includes an input/output (I/O) interface circuit section 1 having a plurality of I/O interface circuits formed therein, and a logic circuit section 2 having a plurality of logic circuits formed therein. The I/O interface circuit section 1 and the logic circuit section 2 are connected to each other to exchange various signals therebetween.

The eDRAM-type semiconductor device further includes a dynamic random access memory (DRAM) section 3 having a memory cell array 3A, an X-decoder 3B, a Y-decoder 3C and a sense amplifier 3D which are formed therein, and the DRAM section 3 is connected to the I/O interface circuit section 1 and the logic circuit section 2 to exchange various signals therebetween.

The memory cell array 3A includes a plurality of regularly-arranged memory cells, and each of the memory cells is composed of a MOS transistor or so-called cell transistor and a capacitor associated therewith. The memory cells are connected to the X-decoder 3B through respective word lines, and are connected to the Y-decoder 3C through respective bit lines, with the Y-decoder 3C being connected to the sense amplifier 3D through lines corresponding to the bit lines.

When a data signal is written in the memory cell array 3A, one of the word lines and one of the bit lines are selected by both the X decoder 3B and the Y decoder 3C in accordance with address signals which are received from either the I/O interface circuit section 1 or the logic circuit section 2, and the data signal is stored in a memory cell addressed by both the selected word and bit lines.

On the other hand, when a data signal is read from the memory cell array 3A, one of the word lines and one of the bit lines are selected by address signals which are received from either the I/O interface circuit section 1 or the logic circuit section 2, and the data signal is output from a memory cell addressed by both the selected word and bit lines. Then, the data signal is amplified by the sense amplifier 3D, and is transmitted to either the I/O interface circuit section 1 or the logic circuit section 2.

As representatively shown in FIG. 2A which is a detailed plan view of a part of the logic circuit section 2 of FIG. 1, a logic circuit included in the logic circuit section 2 may contain a MOS transistor Q and a capacitor C associated therewith.

The MOS transistor Q includes a gate electrode G, and two impurity-diffusion regions R provided along the sides of the gate electrode G, the impurity-diffusion regions R being formed on a semiconductor substrate which is defined as a part of the semiconductor wafer W (see: FIG. 1). One of the impurity-diffusion regions R serves as a source region, and the other impurity-diffusion region serves as a drain region.

On the other hand, the capacitor C is formed as a multi-structural capacitor featuring a large capacitance in an insulating layer (not shown) which is formed on the semiconductor substrate so that the MOS transistor Q is covered with the insulating interlayer.

In particular, three elongated grooves GR are formed in parallel in the aforesaid insulating layer, and a lower electrode layer (not shown) is formed on an area of the insulating layer including the elongated grooves GR, such that the lower electrode layer traverses the elongated grooves GR. Then, a capacitance layer composed of a suitable dielectric material is formed on the lower electrode layer, and an upper electrode layer E is formed on the capacitance layer, resulting in the formation of the multi-structural capacitor C featuring the large capacitance.

Note, in FIG. 2A, reference CONT indicates contact plugs, each of which is formed in the insulating interlayer to establish an electric connection between one of the impurity-diffusion region regions R and the lower electrode layer.

As representatively shown in FIG. 2B which is a detailed plan view of a part of the memory cell array 3A of FIG. 1, the memory cell array 3A includes memory cells which are composed of respective MOS transistors or so-called cell transistors Q1 and Q2 formed on the aforesaid semiconductor substrate (not shown), and capacitors C1 and C2 associated therewith and formed in the aforesaid insulating layer (not shown).

The respective MOS transistors Q1 and Q2 include word lines WL1 and WL2 which serve as gate electrodes for the MOS transistors Q1 and Q2, and impurity-diffusion regions R1 and R2 provided along the outer sides of both the word lines WL1 and WL2, with a common impurity-diffusion region R3 being provided between the word lines WL1 and WL2 so as to be shared with the MOS transistors Q1 and Q2. For example, when the impurity-diffusion regions R1 and R2 serve as drain regions, the common impurity-diffusion region R3 is defined as a source region.

The respective impurity-diffusion regions R1 and R2 are connected to lower electrode layers (not shown) of the capacitors C1 and C2 through contact plugs CONT1 and CONT2 formed in the aforesaid insulating layer. Also, the impurity-diffusion region R3 is connected to a bit line BL through a contact plug CONT3, with the bit line BL and the contact plug CONT3 being formed in the aforesaid insulating layer.

Each of the capacitors C1 and C2 features a smaller capacitance in comparison with the capacitor C (see: FIG. 2A) provided in the logic circuit section 2. For the formation of the capacitors C1 and C2, holes H1 and H2 are formed in the aforesaid insulating layer, and the respective lower electrode layers of the capacitances C1 and C2 are formed on inner wall faces of the holes H1 and H2 so as to be connected to the contact plugs CONT1 and CONT2. Then, capacitance layers composed of a suitable dielectric material are formed on the aforesaid insulating layer and the lower electrodes, and a common upper electrode layer CE is formed on the capacitance layers, resulting in the formation of the capacitors C1 and C2 featuring the small capacitance.

FIGS. 3A through 3K are cross-sectional views for explaining a method for manufacturing the aforesaid eDRAM-type semiconductor device of FIG. 1 having a logic circuit area in which the MOS transistor Q and the capacitance C should be formed, and a memory cell area in which the MOS transistors Q1 and Q2 and the capacitances C1 and C2 should be formed.

First, referring to FIG. 3A, reference 11 indicates a semiconductor substrate which is defined as a part of the semiconductor wafer W (see: FIG. 1), and element-isolation layers 12 and 12 are formed in the semiconductor substrate 11 at the logic circuit area and the memory cell area by using a shallow-trench isolation (STI) method. Namely, by the element-isolation layers 12 and 12, element forming areas are defined and isolated on the semiconductor substrate 11.

As shown in FIG. 3B, gate insulating layers $13_1$ and $13_2$ are formed on the semiconductor substrate 11 at the memory cell area by thermally oxidizing the semiconductor substrate 11. Although not visible in FIG. 3B, a gate insulating layer is simultaneously formed on the semiconductor substrate 11 at the logic circuit area.

Then, gate electrodes $14_1$ and $14_2$ are formed on the respective gate insulating layers $13_1$ and $13_2$, and may be composed of a suitable conductive material, such as titanium, polycrystalline or the like. Subsequently, side walls 15 are formed along the sides of both the gate insulating layer ($13_1$, $13_2$) and the gate electrode ($14_1$, $14_2$). Note, the gate electrodes $14_1$ and $14_2$ serve as the word lines WL1 and WL2 (see: FIG. 2B).

Although not visible in FIG. 3B, when the gate electrodes $14_1$ and $14_2$ are formed, a gate electrode (indicated by reference G in FIG. 2A) is simultaneously formed on the gate insulating layer formed on the semiconductor substrate 11 at the logic circuit area. Similarly, when the side walls 15 are formed, side walls are simultaneously formed along the sides of the gate insulating layer at the logic circuit area.

After the formation of the side walls 15 is completed, impurity-diffusion regions 16 (indicated by R in FIG. 2A) are formed along the respective sides of the gate electrode formed on the semiconductor substrate 11 at the logic circuit area, resulting in the formation of the MOS transistor Q (see: FIG. 2A) at the logic circuit area. Note, in FIG. 3B, only one of the impurity-diffusion regions 16 (R) is visible.

On the other hand, impurity-diffusion regions $16_1$, $16_2$ and $16_3$ (indicated by $R_1$, $R_2$ and $R_3$ in FIG. 2B) are formed in the semiconductor substrate 11 at the memory cell area, resulting in the formation of the MOS transistors $Q_1$ and $Q_2$. As already stated with reference to FIG. 2B, the impurity-diffusion region $16_3$ ($R_3$) is shared as a common impurity-diffusion region with the MOS transistors $Q_1$ and $Q_2$.

Next, referring to FIG. 3C, an insulating layer 18 composed of silicon dioxide is formed on the semiconductor substrate 11 by using a chemical vapor deposition (CVD) process so that the MOS transistors Q, and $Q_1$ and $Q_2$ are covered with the insulating layer 18. Then, contact plugs 19 composed of a suitable metal material, such as aluminum or the like, are formed in the insulating layer 18 at the logic circuit area so as to be contacted with the impurity-diffusion region 16(R). Simultaneously, contact plugs $19_1$, $19_2$ and $19_3$ composed of a suitable metal material, such as aluminum or the like, are formed in the insulating layer 18 at the memory cell area so as to be contacted with the respective impurity-diffusion regions $16_1$, $16_2$ and $16_3$ ($R_1$, $R_2$ and $R_3$).

Note that the formation of the contact plugs 19, $19_1$, $19_2$ and $19_3$ may be carried out by using a photolithography and etching process, a sputtering process and a chemical mechanical polishing (CMP) process and so on.

Then, a bit line 20 (indicated by reference BL in FIG. 2B) is formed on the insulating layer 18 so as to be contacted with the contact plug $19_3$, by using a sputtering process and a photolithography/etching process.

Next, referring to FIG. 3D, an insulting layer 21 composed of silicon dioxide is formed on the insulting layer 18 by using a CVD process. Then, at the logic circuit area, extensions 19' of the respective contact plugs 19 are formed in the insulating layer 21. Simultaneously, at the memory cell area, extensions $19_1$', and $19_2$' of the contact plugs $19_1$ and $19_2$ are formed in the insulating layer 21. Namely, the respective contact plugs 19 and extensions 19' form the contact plugs CONT (see: FIG. 2A), the respective contact plugs $19_1$ and $19_2$ and extensions $19_1$' and $19_2$' form the contact plugs CONT1 and CONT2 (see: FIG. 2B), with the contact plug $19_3$ defining the contact plug CONT3 (see: FIG. 2B).

Note, preferably, all the contact plugs CONT, CONT1, CONT2 and CONT3 have the same diameter, and the contact plugs CONT, CONT1 and CONT2 have the same height.

Note that the formation of the extensions 19', $19_1$' and $19_2$' may be also carried out by using a photolithography and etching process, a sputtering process and a chemical mechanical polishing (CMP) process and so on.

Next, referring to FIG. 3E, an insulting layer 22 composed of silicon dioxide is formed on the insulting layer 21 by using a CVD process. Then, three elongated grooves 23 (indicated by reference GV in FIG. 2A) are formed in the insulating layer 22 at the logic circuit area, so that the top end faces of the extensions 19' are exposed to the exterior at the respective bottoms of the elongated grooves 23. At the same time, holes $23_1$ and $23_2$ (indicated by references $H_1$ and $H_2$ in FIG. 2B) are formed in the insulating layer 22 at the memory cell area.

Note, preferably, a depth of the grooves 23 and a depth of the holes $23_1$ and $23_2$ are substantially equivalent to each other, and the grooves 23 and holes $23_1$ and $23_2$ are placed at the same level.

Note that the formation of the grooves 23 and the holes $23_1$ and $23_2$ may be carried out by using a photolithography and etching process.

Then, a suitable metal layer 24 is formed on the insulating layer 22 by using, for example, a sputtering process, so that the metal layer 24 extends so as to traverse the elongated grooves 23 and the holes $23_1$ and $23_2$.

Figure 3F:
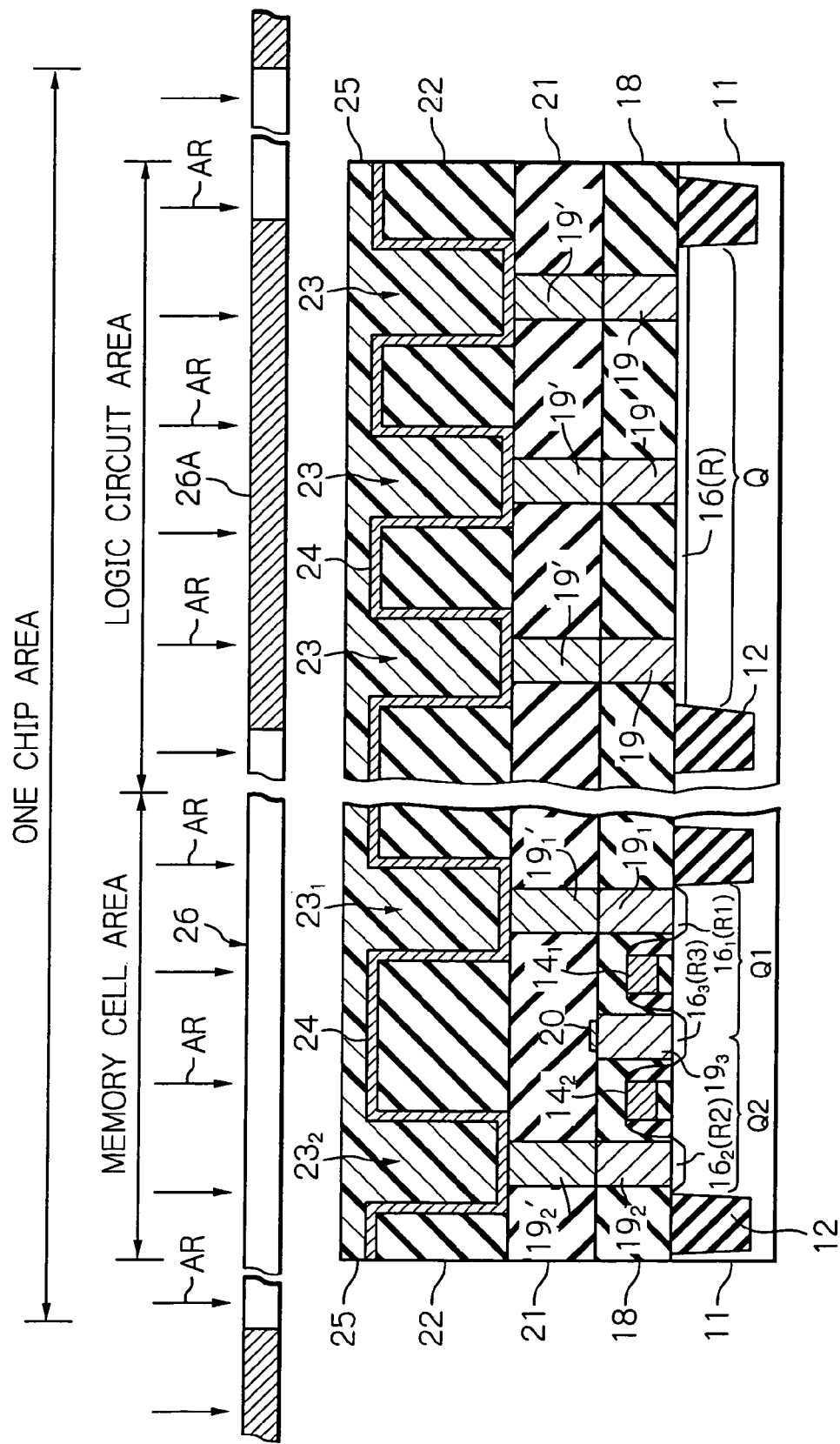

Next, referring to FIG. 3F, the metal layer 24 is coated with photoresist resin by using a spin coat process, so that a photoresist resin layer 25 is formed on the metal layer 24, with the elongated grooves 23 and the holes $23_1$ and $23_2$ being filled with photoresist resin materials.

Then, the semiconductor wafer W (see: FIG. 1) is masked with a photomask 26 so that only one of the semiconductor chip areas CH (see: FIG. 1) on the semiconductor wafer W can be subjected to an exposure process. Also, as representatively shown in FIG. 3F, the photomask 26 has a mask element 26A for masking a rectangular area including the elongated grooves 23 formed in the insulating layer 22 at the logic circuit area.

Then, the semiconductor chip area CH concerned is subjected to the exposure process. Namely, the photoresist layer 25 on the semiconductor chip area CH is exposed with a light ray which is symbolically represented by arrows AR.

In this case, a diameter of the holes $23_1$ and $23_2$ and an exposure time for the light ray are previously selected in accordance with a wavelength of the light ray to be used, so that the photoresist resin materials, with which the holes $23_1$ and $23_2$ are stuffed, are not exposed with the light ray. On the other hand, if the photomask has no mask element 26A, the photoresist resin materials, with which the elongated grooves 23 are stuffed, are exposed with the light ray, but in reality these photoresist resin materials cannot be exposed with the light ray due to the existence of the mask element 26A.

Note, in the above-mentioned exposure process, for example, it is possible to use any one of an i-ray, a KrF-ray and an ArF-ray as the light ray.

Next, referring to FIG. 3G, the photoresist resin layer 25 (see: FIG. 3F) is subjected to a developing process, in which the exposed photoresist resin material is removed from the photoresist resin layer 25, so that the not exposed resin materials are left as photoresist resin masks 25', $25_1$' and $25_2$'.

Next, referring to FIG. 3H, the metal layer 24 (see: FIG. 3G) is subjected to an etching process in which the exposed portion of the metal layer 24 is etched therefrom. As a result, the portion of the metal layer 24 covered with the photoresist resin mask 25 is left as a lower electrode layer 24'. Namely, the lower electrodes 24' includes first portions formed on inner wall faces of the respective elongated grooves 23, and a second portion on formed on a surface of the insulating layer 22 surrounding the elongated grooves 23, the second portions being integrated with the second portions. On the other hand, the respective portions of the metal layer 24 covered with the photoresist resin masks $25_1$' and $25_2$' are left as lower electrode layer layers $24_1$' and $24_2$'.

Figure 3I:
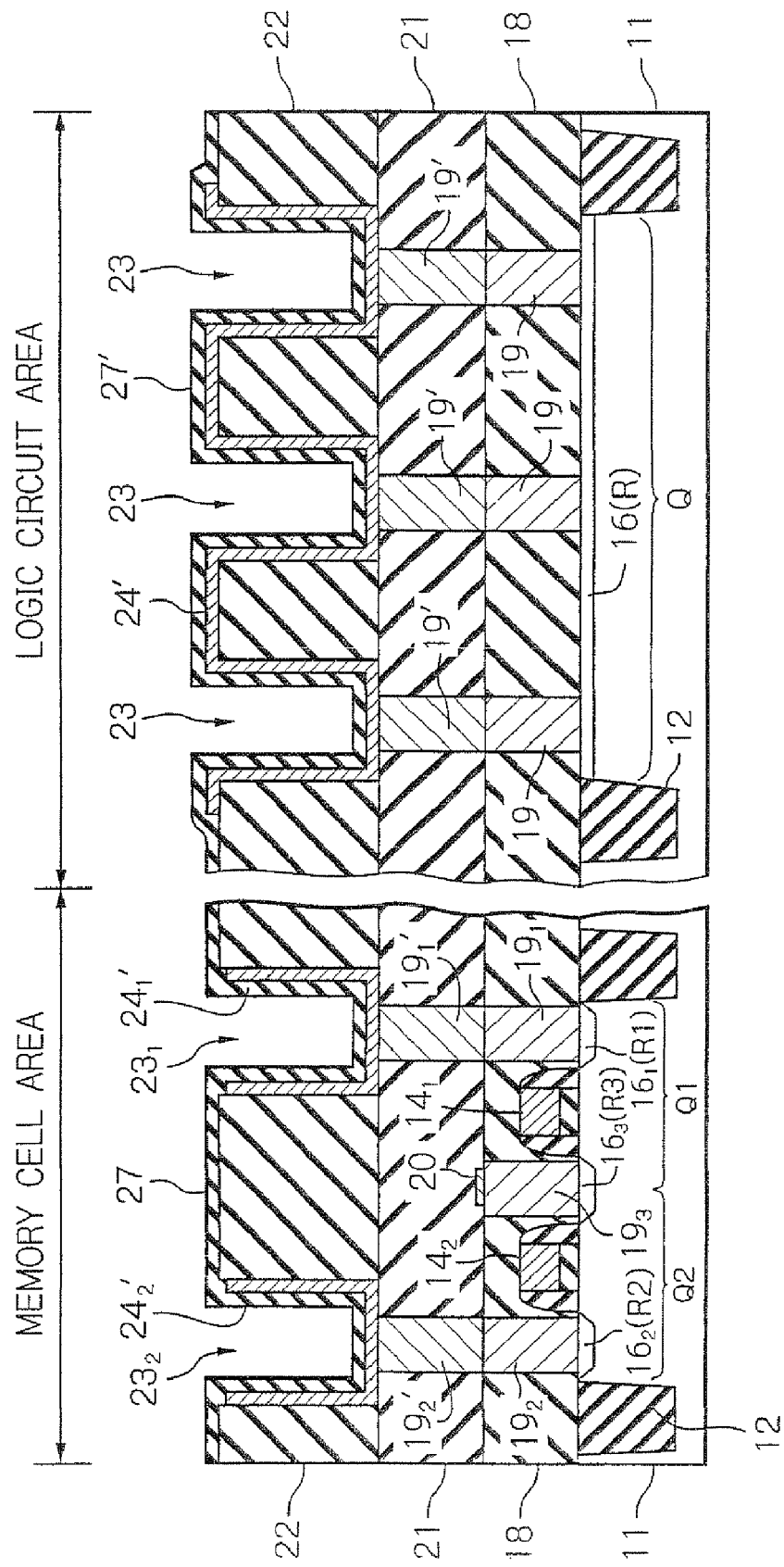

Next, referring to FIG. 3I, the photoresist resin mask 25' (see: FIG. 3H) is removed from the lower electrode layer 24', and the respective photoresist resin masks $25_1$' and $25_2$' (see: FIG. 3H) are removed from the lower electrode layers $24_1$' and $24_2$'. Then, a suitable dielectric layer 27, which may be composed of silicon dioxide, is formed by using a CVD process on the insulating layer 22, the lower electrode layer 24' and the lower electrode layers $24_1$' and $24_2$'.

Figure 3J:
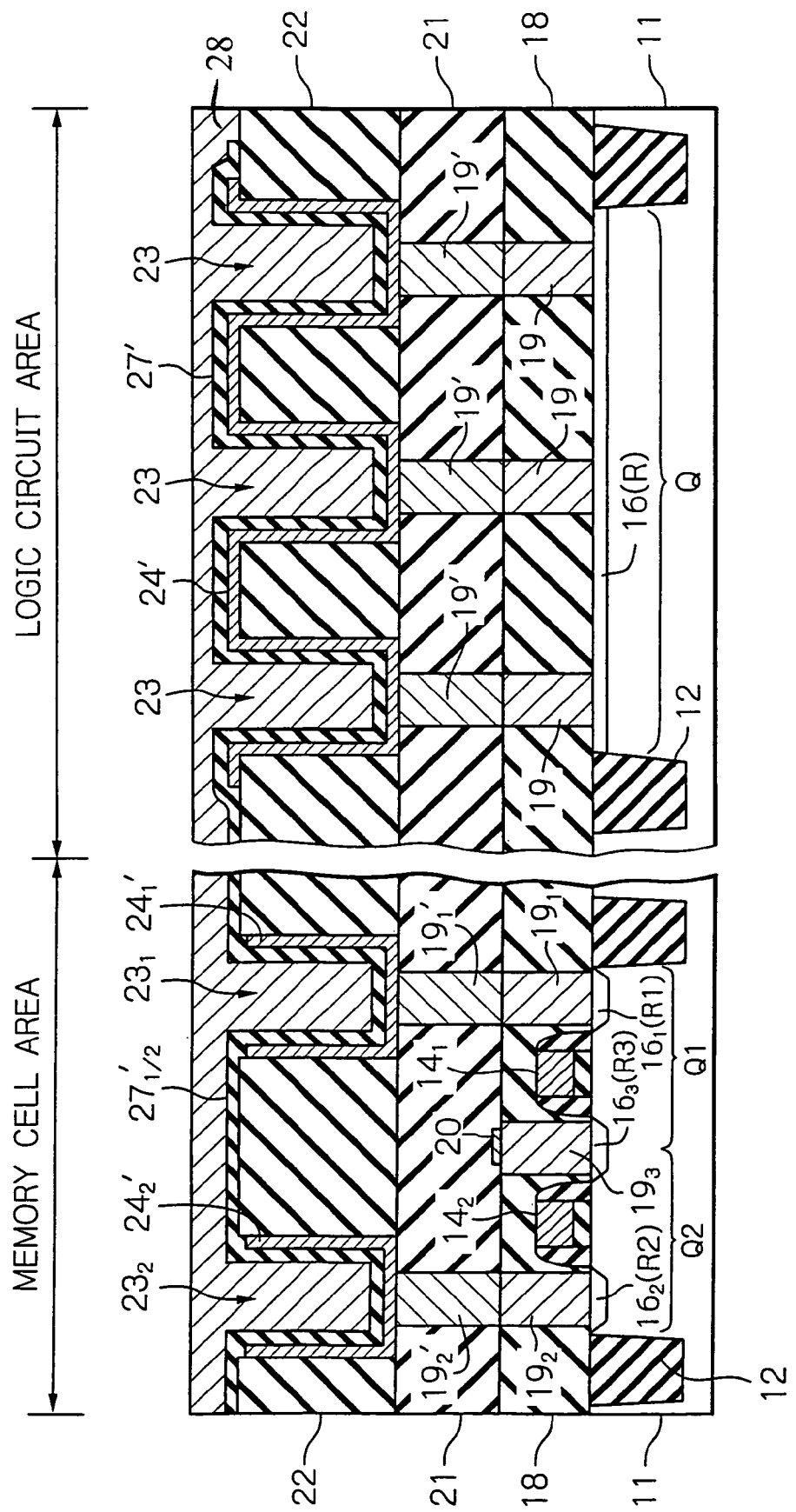

Next, referring to FIG. 3J, the dielectric layer 27 (see: FIG. 3I) is patterned by using a photolithography and etching process, so that a capacitance layer 27' is formed on the lower electrode layer 24' at the logic circuit area, and so that a capacitance layer $27_{1/2}$' is formed on the insulating layer 22 and the lower electrode layers $24_1$ and $24_2$' at the memory cell area. Then, a metal layer 28 is formed on the insulating layer 22, the capacitance layers 27' and $27_{1/2}$' by using a sputtering process.

Next, referring to FIG. 3K, the metal layer 28 (see: FIG. 3J) is patterned by using a photolithography and etching process, so that an upper electrode 28' (indicated by reference E in FIG. 2A) is formed on the capacitance layer 27' at the logic circuit area, and so that a common upper electrode layer $28_{1/2}$' (indicated by reference CE in FIG. 2B) is formed on the capacitance layer $27_{1/2}$' at the memory cell area.

Thus, at the logic circuit area, the multi-structural capacitor C (see: FIG. 2A) featuring the large capacitance is constructed by the lower electrode layer 24', the capacitance layer 27' and the upper electrode layer 28'. Also, at the memory cell area, the capacitors C1 and C2 (see: FIG. 2B) featuring the small capacitance are constructed by the lower electrode layers $24_1$, and $24_2$', the capacitance layer $27_{1/2'}$, and the common upper electrode layer $28_{1/2''}$.

Thereafter, although not shown in FIG. 3K, an insulating layer, which may be composed of silicon dioxide, is further formed on the insulating layer 22 so that the upper electrode 28' and the common upper electrode layer $28_{1/2}$' are covered therewith.

Note, in FIG. 3K, the cross-sectional view at the logic circuit area corresponds to a cross-sectional view taken along the line L-L of FIG. 2A, the cross-sectional view at the memory cell area corresponds to a cross-sectional view taken along the line M-M of FIG. 2B.

Figure 4:
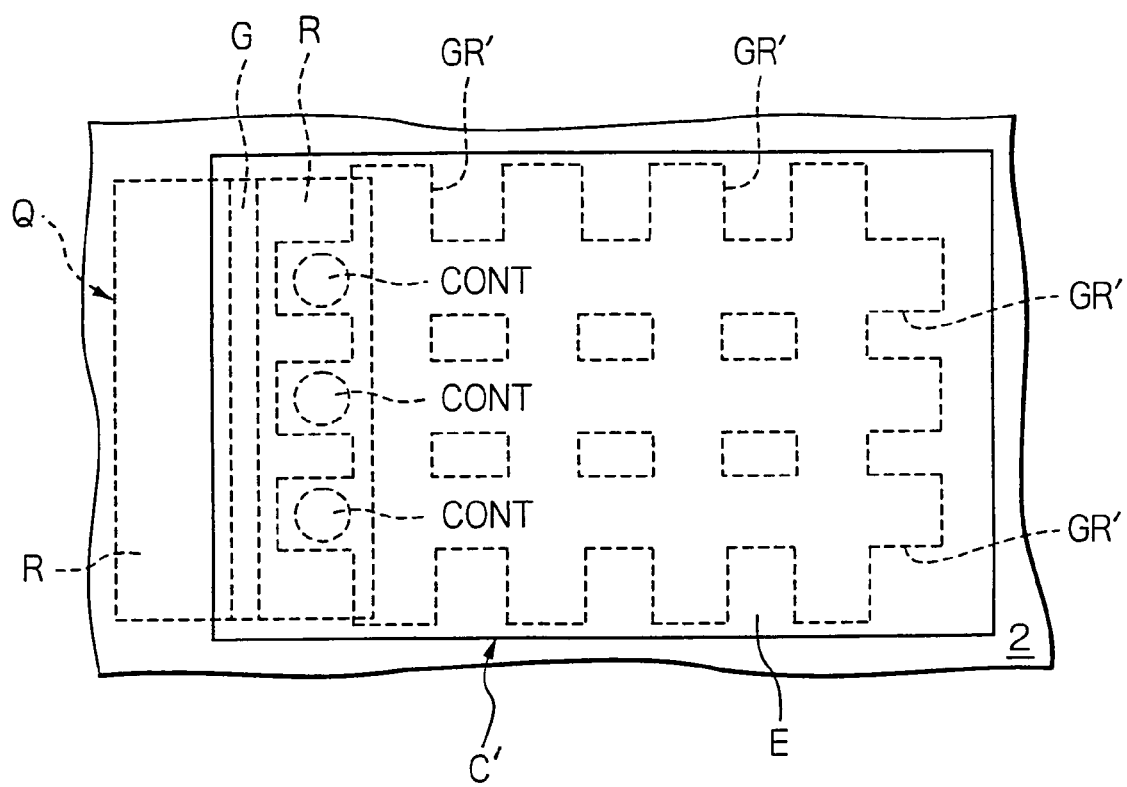
FIG. 4 is a partial plan view showing a modification of the multi-structural capacitor of FIG. 2A.

FIG. 4 shows a modification of the multi-structural capacitor C formed in the logic circuit section 2. In this modified multi-structural capacitor, indicated by reference C', grid-like grooves GR' are substituted for the discrete elongated grooves GR of FIG. 2A.

In particular, the grid-like grooves GR' are formed in the insulating layer, and a lower electrode layer (not shown) is formed on an area of the insulating layer including the grid-like grooves GR', such that the lower electrode layer traverses the grid-like grooves GR. Then, a capacitance layer (not shown), which may be composed of silicon dioxide, is formed on the lower electrode layer, and an upper electrode layer E is formed on the capacitance layer, resulting in the formation of the multi-structural capacitor C' featuring a larger capacitance than that of the multi-structural capacitor C of FIG. 2A due to the use of the grid-like grooves GR'. Also, it is possible to simultaneously carry out the formation of the multi-structural capacitor C' and the formation of the capacitors C1 and C2 of FIG. 2B based on the method as explained with reference to FIGS. 3A through 3K.

Finally, it will be understood by those skilled in the art that the foregoing description is of preferred embodiments of the devices and the methods, and that various changes and modifications may be made to the present invention without departing from the spirit and scope thereof.

The invention claimed is:

1. An eDRAM-type semiconductor device comprising:
a semiconductor substrate;
a dynamic random access memory (DRAM) section formed on said semiconductor substrate;
a logic circuit section formed on said semiconductor substrate;
an insulating layer formed on said semiconductor substrate;
a first capacitor formed in said insulating layer at said DRAM section, said first capacitor defining a part of a memory cell of said DRAM section; and
a second capacitor formed in said insulating layer at said logic circuit section,
wherein said first capacitor comprises a lower electrode layer formed on an inner wall face of a hole formed in said insulating layer, when viewed from above the device the hole having a generally circular shape,
said second capacitor comprises a first lower electrode layer portion formed on an inner wall face of at least one groove formed in said insulating layer, when viewed from above the device the groove having a generally rectangular shape, and a second lower electrode layer portion formed directly above a topmost surface of said insulating layer so as to be integrated with said first lower electrode portion,
a depth of said hole and a depth of said groove are substantially equivalent to each other,
said first and second capacitors are placed at a same level, and
said first capacitor has a smaller capacitance than said second capacitor.

2. The eDRAM-type semiconductor device as set forth in claim 1, wherein said second capacitor has a contact plug formed in said insulating layer so as to be connected to said first lower electrode layer portion.

3. The eDRAM-type semiconductor device as set forth in claim 1, wherein said respective first and second capacitors have contact plugs formed in said insulating layer so as to be connected to said lower electrode layer and said first lower electrode portion, heights of said contact plugs being substantially equivalent to each other.

4. The eDRAM-type semiconductor device as set forth in claim 3, wherein diameters of said contact plugs are substantially equivalent to each other.

5. The eDRAM-type semiconductor device as set forth in claim 1, wherein there are three grooves.

6. An eDRAM-type semiconductor device comprising:
a semiconductor substrate;
a dynamic random access memory (DRAM) section formed on said semiconductor substrate;
a logic circuit section formed on said semiconductor substrate;
an insulating layer formed on said semiconductor substrate;
a plurality of first capacitors formed in said insulating layer at said DRAM section, each of said first capacitors defining a part of a same memory cell of said DRAM section; and
a second capacitor formed in said insulating layer at said logic circuit section,
wherein said first capacitors comprise respective lower electrode layers formed on inner wall faces of holes formed in said insulating layer, when viewed from above the device the holes having a generally circular shape,
said second capacitor comprises a plurality of first lower electrode layer portions formed on inner wall faces of grooves formed in said insulating layer, when viewed from above the device the grooves having a generally rectangular shape, and a second lower electrode layer portion formed directly above a topmost surface of said insulating layer so as to be integrated with said first lower electrode portions,
a depth of said holes and a depth of said grooves are substantially equivalent to each other,
said first capacitors and said second capacitor are placed at a same level, and
said first capacitors have a smaller capacitance than said second capacitor.

7. The eDRAM-type semiconductor device as set forth in claim 6, wherein said grooves are arranged in parallel with each other.

8. The eDRAM-type semiconductor device as set forth in claim 6, wherein said grooves are arranged in a grid-like manner.

9. The eDRAM-type semiconductor device as set forth in claim 6, wherein said first capacitors have respective contact plugs formed in said insulating layer so as to be connected to said lower electrode layers, and said second capacitor has contact plugs formed in said insulating layer so as to be connected to said respective first lower electrode layer portions, heights of all said contact plugs being substantially equivalent to each other.

10. The eDRAM-type semiconductor device as set forth in claim 9, wherein diameters of all said contact plugs are substantially equivalent to each other.

11. The eDRAM-type semiconductor device as set forth in claim 6, wherein there are three grooves.

* * * * *